(12) United States Patent
Liu et al.

(10) Patent No.: US 10,254,310 B2
(45) Date of Patent: Apr. 9, 2019

(54) ELECTRICAL PROBE WITH A PROBE HEAD AND CONTACTING PINS

(71) Applicant: CHROMA ATE INC., Taoyuan (TW)

(72) Inventors: Mao-Sheng Liu, Taoyuan (TW); Hsiu-Wei Kuo, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 114 days.

(21) Appl. No.: 15/497,840

(22) Filed: Apr. 26, 2017

(65) Prior Publication Data
US 2017/0322235 A1 Nov. 9, 2017

(30) Foreign Application Priority Data

May 6, 2016 (TW) .............................. 105114208 A

(51) Int. Cl.
*G01R 1/067* (2006.01)
*G01R 31/00* (2006.01)
*G01R 1/073* (2006.01)

(52) U.S. Cl.
CPC ..... *G01R 1/07342* (2013.01); *G01R 1/06716* (2013.01)

(58) Field of Classification Search
CPC ............ G01R 1/06716; G01R 1/07342; G01R 1/0466; G01R 1/07364; G01R 31/26; G01R 31/2889; G01R 31/2874
See application file for complete search history.

(56) References Cited

U.S. PATENT DOCUMENTS

| | | | | |
|---|---|---|---|---|
| 5,670,889 | A * | 9/1997 | Okubo | G01R 1/07342 324/756.03 |
| 7,256,591 | B2 * | 8/2007 | Tatematsu | G01R 1/07314 324/755.07 |
| 2004/0119463 | A1 * | 6/2004 | Lou | G01R 1/07342 324/750.08 |
| 2013/0285690 | A1 * | 10/2013 | Andberg | G01R 31/2886 324/754.03 |

* cited by examiner

*Primary Examiner* — Minh N Tang
(74) *Attorney, Agent, or Firm* — Maschoff Brennan

(57) ABSTRACT

An electrical probe includes a main body, a probe head and a plurality of pins. The probe head is disposed on the main body, and the probe head has a surface and a plurality of openings on the surface. Each pin includes a contacting portion and an inserting portion connected to each other. Each pin has an obtuse angle between the contacting portion and the inserting portion, and the inserting portions of the pins respectively inserted into the openings.

13 Claims, 13 Drawing Sheets

ELECTRICAL PROBE WITH A PROBE HEAD AND CONTACTING PINS

CROSS-REFERENCE TO RELATED APPLICATIONS

This non-provisional application claims priority under 35 U.S.C. § 119(a) on Patent Application No(s). 105114208 filed in Taiwan R.O.C. on May 6, 2016, the entire contents of which are hereby incorporated by reference.

TECHNICAL FIELD

The present disclosure provides an electrical probe, more particular to an electrical probe for electrical properties test.

BACKGROUND

At the present industry, electrical probes are utilized for electrical properties measurement; especially, the electrical probes are utilized for measuring high current flow from tens to hundreds of Ampere. Before products being shipped, manufacturers can conduct electrical properties tests to these products by the electrical probe in order to ensure high yield and good reliability. According to the requirements of decreasing heat generation and ensuring large contacting area, the electrical probes will directly in contact with the surface of the products to accurately measure electrical resistance or voltage during the electric properties test.

SUMMARY

According to the disclosure, an electrical probe includes a main body, a probe head and a plurality of pins. The probe head is disposed on the main body, and the probe head has a surface and a plurality of openings on the surface. Each pin includes a contacting portion and an inserting portion connected to each other. Each pin has an obtuse angle between the contacting portion and the inserting portion, and the inserting portions of the pins respectively inserted into the openings.

According to the disclosure, an electrical probe includes a main body, a probe head and a plurality of pins. The main body includes an assembling member and a conductive member disposed through the assembling member. The probe head is disposed on the main body, and the probe head has a surface, a through hole and a plurality of openings. The openings and the through hole are on the surface, and the conductive member is disposed through the through hole. Each pin includes a contacting portion and an inserting portion connected to each other. The inserting portions of the pins are respectively inserted into the openings. The contacting portion extends from the surface along a direction away from the probe head, and an extension axis of the contacting portion and a central axis of the through hole has an acute angle therebetween.

BRIEF DESCRIPTION OF THE DRAWINGS

The present disclosure will become more understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1A:
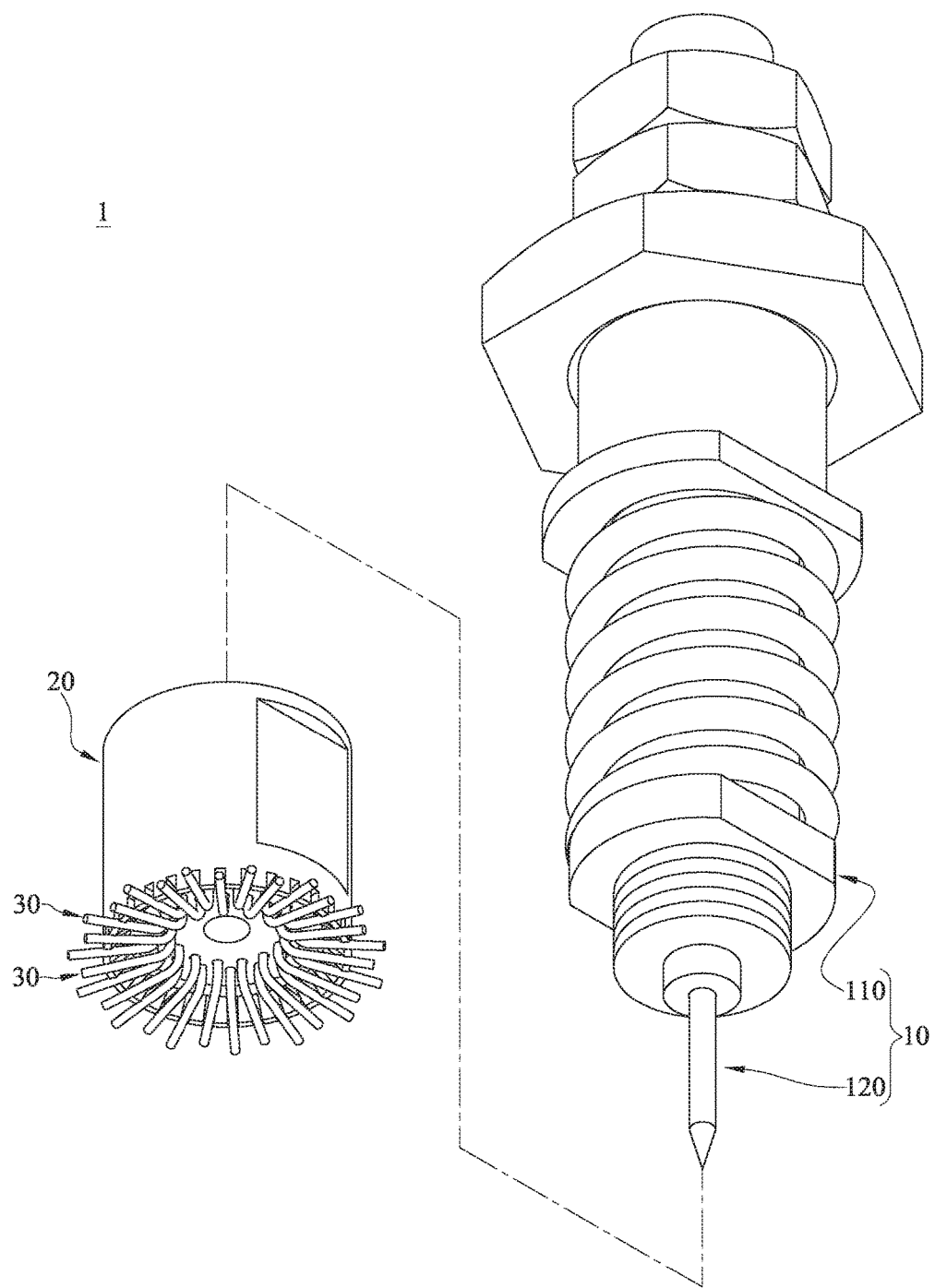
FIG. 1A is an exploded view of an electrical probe according to a first embodiment of the disclosure.
Figure 1B:
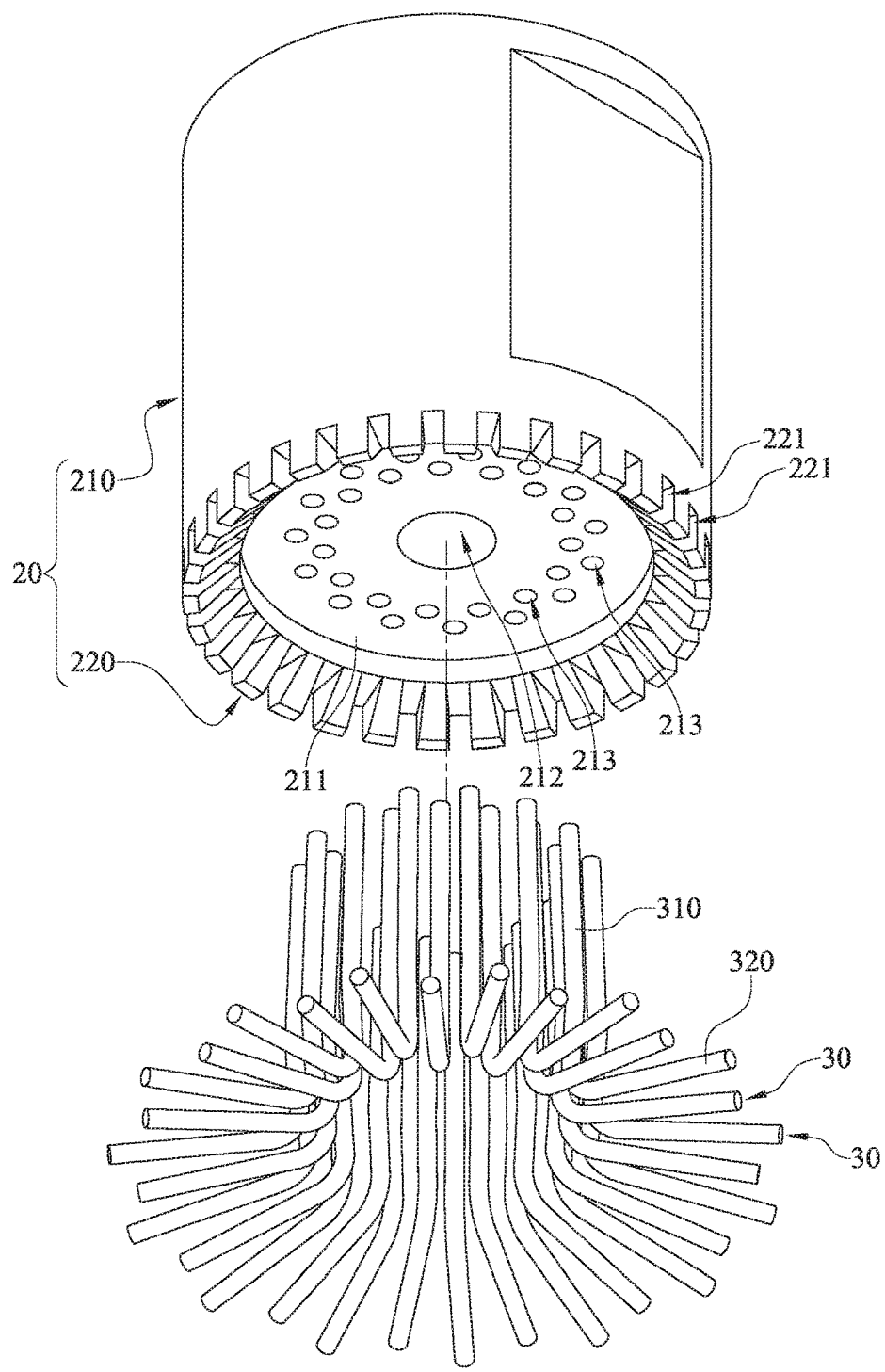
FIG. 1B is an exploded view of a probe head and a plurality of pins in FIG. 1A.
Figure 1C:
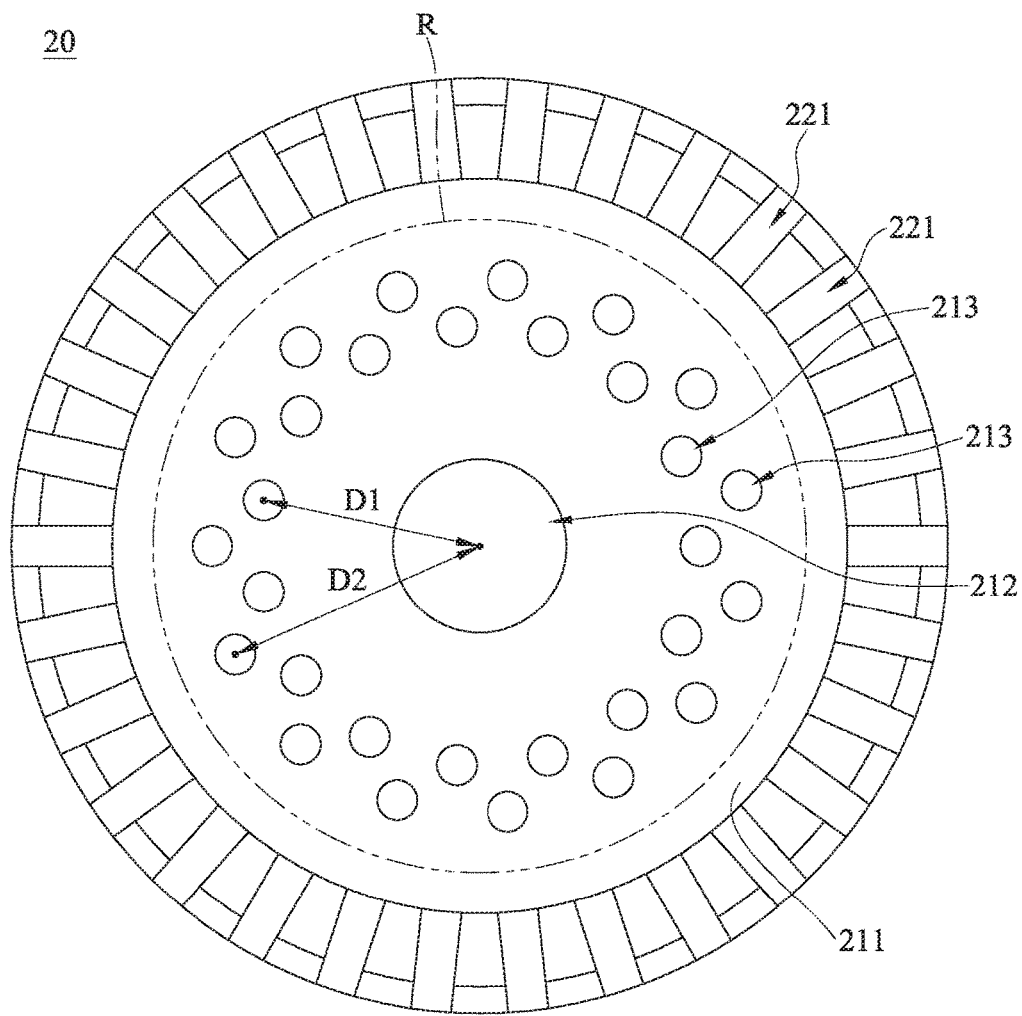
FIG. 1C is a bottom view of the probe head in FIG. 1B.
Figure 1D:
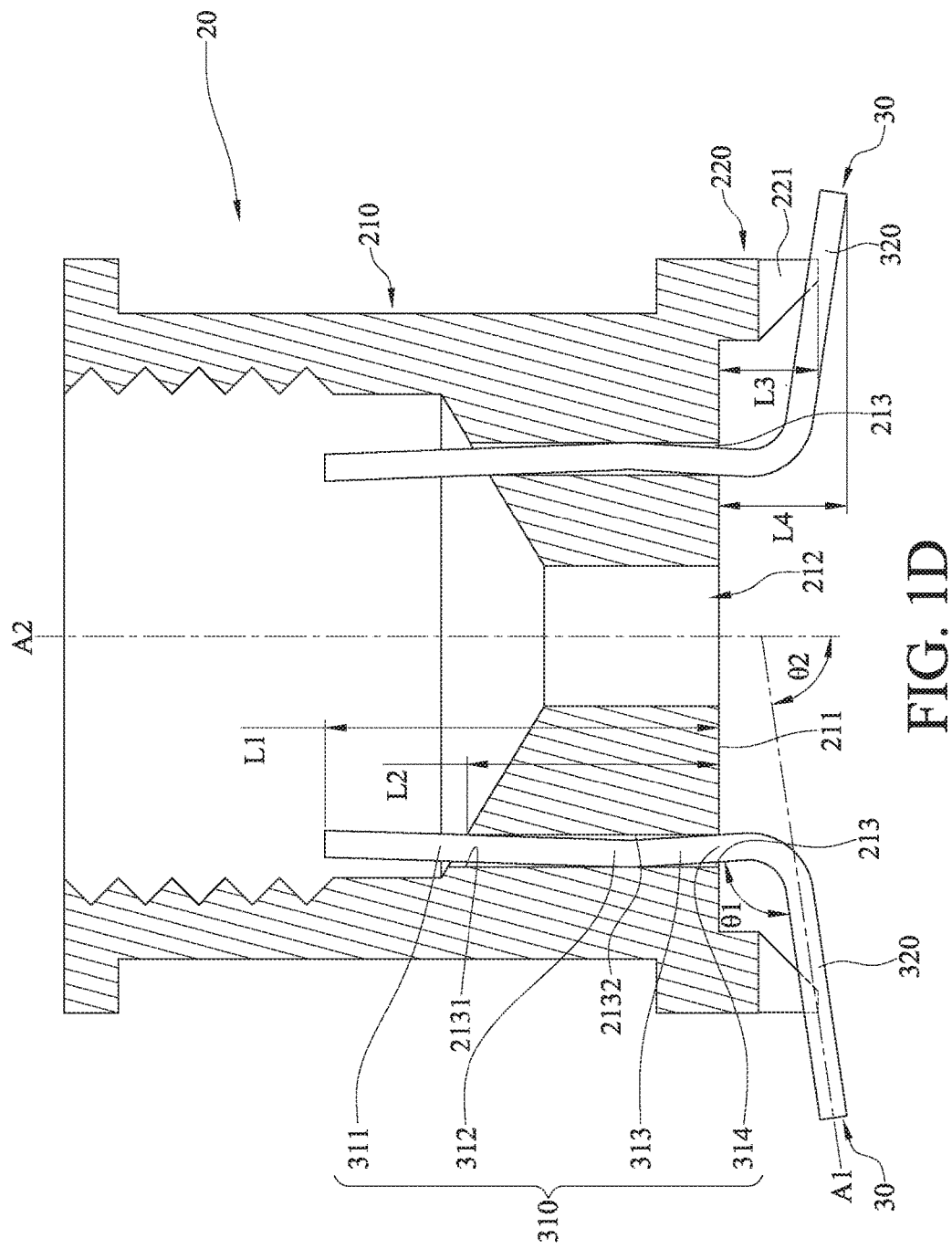
FIG. 1D is a cross-sectional view of the electrical probe head and the pins in FIG. 1A.

Please refer to FIG. 1A to FIG. 1D. FIG. 1A is an exploded view of an electrical probe according to a first embodiment of the disclosure. FIG. 1B is an exploded view of a probe head and a plurality of pins in FIG. 1A. FIG. 1C is a bottom view of the probe head in FIG. 1B. FIG. 1D is a cross-sectional view of the electrical probe head and the pins in FIG. 1A.

In this embodiment, an electrical probe 1 includes a main body 10, a probe head 20 and a plurality of pins 30. The quantity of the pins 30 is not restricted in the disclosure; it can be changed according to actual requirements. For example, in some embodiments, the quantity of the pin 30 is one. In addition, the main body 10, the probe head 20 and the pins 30 are all made of electrically conductive material.

The main body 10 includes an assembling member 110 and a conductive member 120. The conductive member 120 is disposed through the assembling member 110. The probe head 20 is detachably disposed on the assembling member 110 of the main body 10. In detail, in this embodiment, the probe head 20 is screwed to an end of the assembling member 110.

The probe head 20 includes a base portion 210 and a circular extending portion 220. The base portion 210 has a surface 211, a through hole 212 and a plurality of openings 213. The quantity of the multiple openings 213 is not restricted in the disclosure; it can be changed according to actual requirements. For example, in some embodiments, the quantity of the opening 213 is one. In this embodiment, the surface 211 is circular, but the disclosure is not limited thereto. The shape of the surface of the base portion can be modified according to actual requirements as well. The through hole 212 and the openings 213 are on the surface 211. In detail, the through hole 212 is on the center of the surface 211 and is surrounded by the openings 213. The conductive member 120 is disposed through the through hole 212 from the assembling member 110. The circular extending portion 220 is connected to an edge of the base portion 210 and extends in a direction away from the base portion 210. The circular extending portion 220 has a plurality of recesses 221, but the disclosure is not limited to the quantity of the recesses 221. The quantity of the recesses 221 can be modified according to the quantity of the pins 30.

The bendable pins 30 are respectively detachably inserted into the openings 213. In detail, each pin 30 includes an inserting portion 310 and a contacting portion 320 connected to each other. The inserting portion 310 is inserted into the opening 213, and the diameter of the opening 213 is larger than the outer diameter of the inserting portion 310. Each inserting portion 310 includes a first extending section 311, a bent section 312, a second extending section 313 and a connecting section 314 which are connected together. The bent section 312 is located between the first extending section 311 and the second extending section 313, and the connecting section 314 is located between the second extending section 313 and the contacting portion 320. That is, the inserting portion 310 is connected to the contacting portion 320 by the connecting section 314. Each opening 213 has a first inner side wall 2131 and a second inner side wall 2132, and the second inner side wall 2132 is closer to the through hole 212 than the first inner side wall 2131 is to the through hole 212. The first extending section 311 extends from the bent section 312 toward the assembling member 110 of the main body 10, and the second extending section 313 extends from the connecting section 314 toward the first inner side wall 2131. The bent section 312 is pressed against the first inner side wall 2131, and the connecting section 314 is pressed against the second inner side wall 2132. The contacting portion 320 extends from the surface 211 of the probe head 20 in a direction away from the base portion 210, and further extends in a direction away from the through hole 212. The contacting portions 320 respectively correspond to the recesses 221 of the circular extending portion 220; that is, a part of the contacting portion 320 is located right below the recess 221. In this embodiment, a length L1 of the inserting portion 310 in the base portion 210 is larger than a length L2 of the opening 213, and a length L3 of the circular extending portion 220 in the normal direction of the surface 211 is smaller than a length L4 of the contacting portion 320 in the normal direction of the surface 211. In some embodiments, the length L1 of the inserting portion 310 in the base portion 210 is equal to the length L2 of the opening 213.

In this embodiment, each pin 30 has an obtuse angle $\theta 1$ between the inserting portion 310 and the contacting portion 320 and an acute angle $\theta 2$ between the extension axis A1 of the contacting portion 320 and the central axis A2 of the through hole 212. In this embodiment, the obtuse angle $\theta 1$ is less than or equal to 105 degrees, and the acute angle $\theta 2$ is greater than or equal to 75 degrees. However, the disclosure is not limited to the values of the angles $\theta 1$ and $\theta 2$. The values of the angles may be changed according to actual requirements.

Furthermore, as shown in FIG. 1C, the through hole 212 are surrounded by the openings 213 which are arranged along a reference path R and in a staggered pattern. A distance D1 between the through hole 212 and one of the openings 213 relatively close to the through hole 212 is smaller than a distance D2 between the through hole 212 and one of the other openings 213 relatively away from the through hole 212.

Figure 1E:
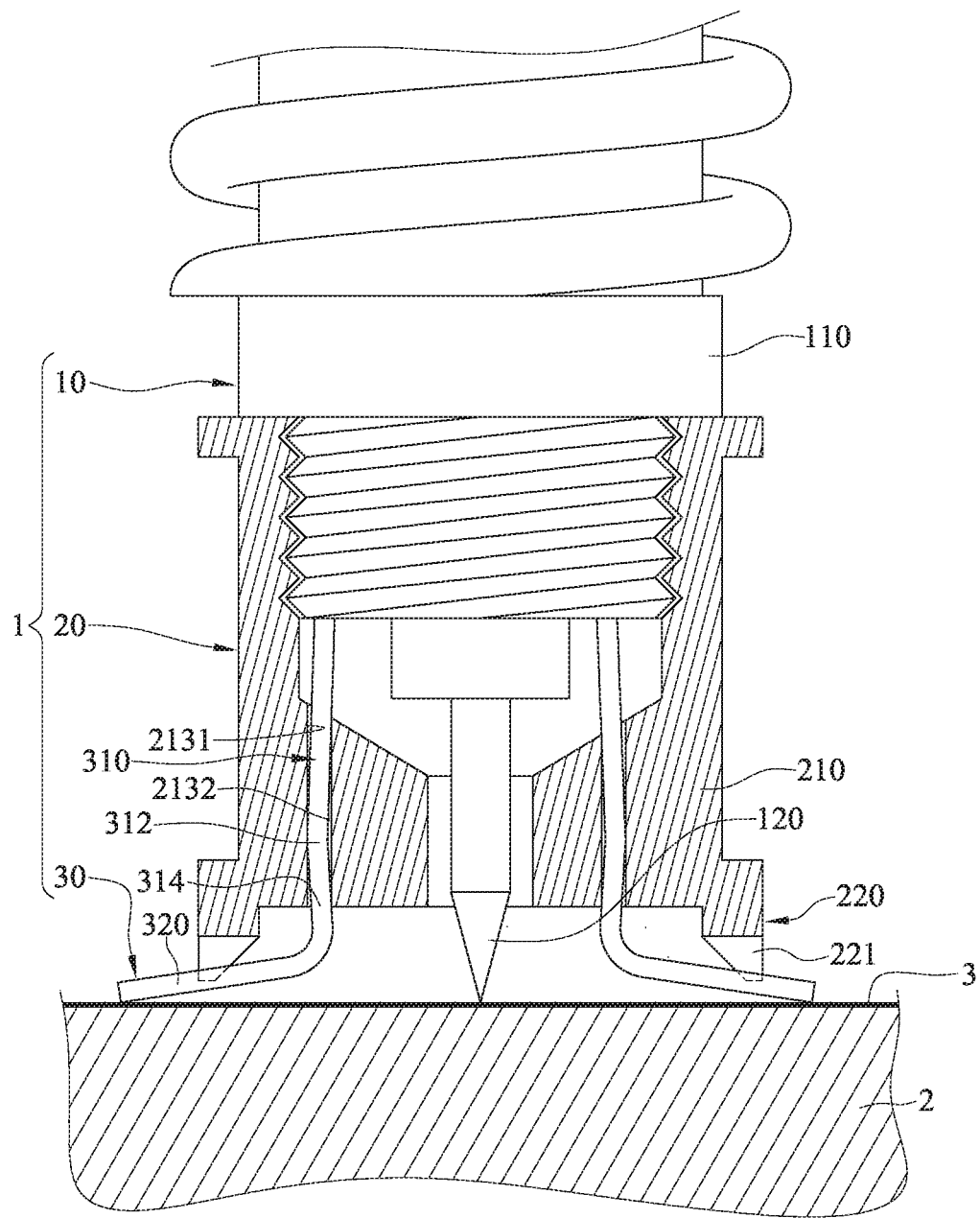
FIG. 1E is a cross-sectional view of the electrical probe in FIG. 1A when being pressed against a high-resistance film on a test object.
Figure 1F:
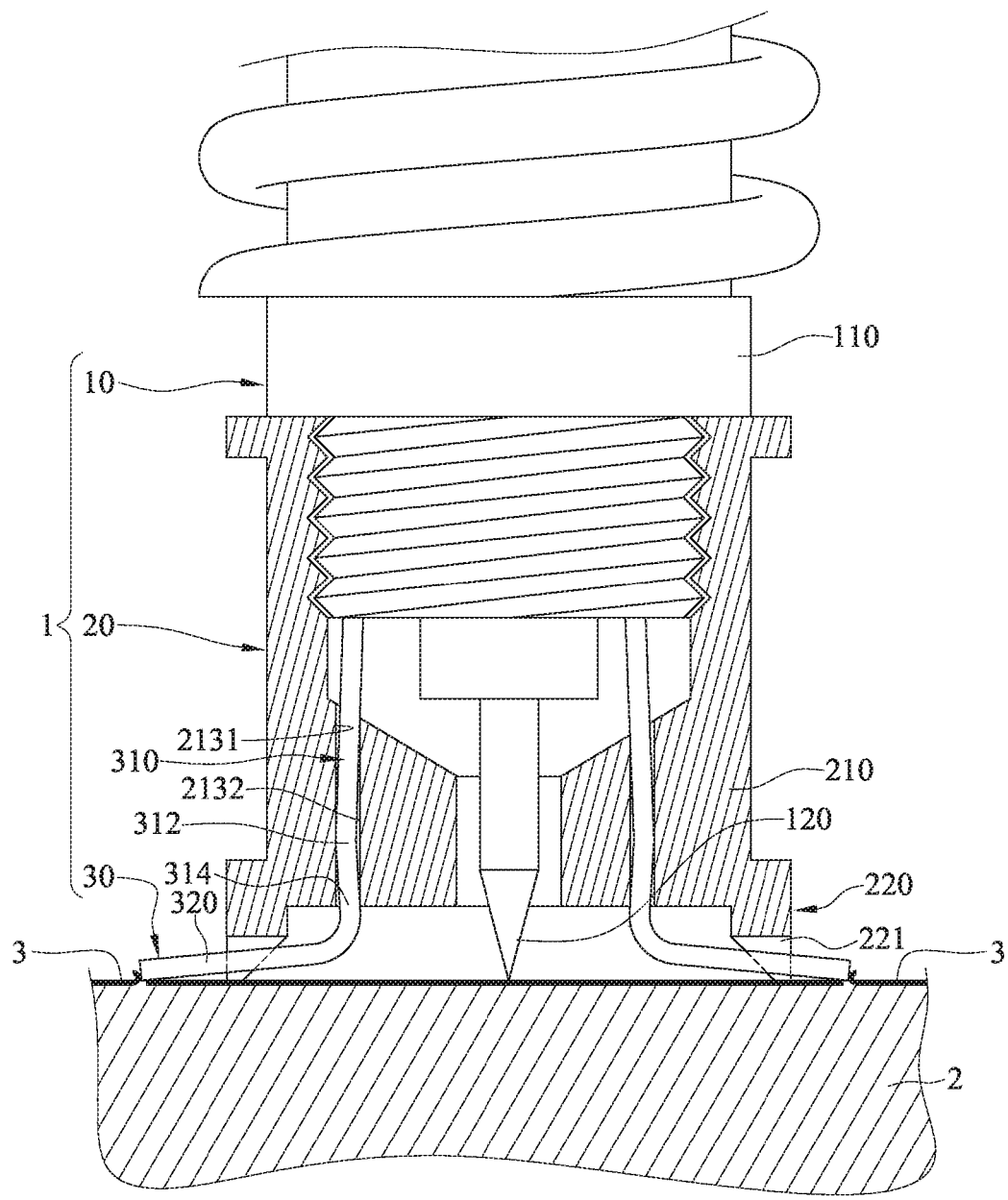
FIG. 1F is a cross-sectional view of the electrical probe and the test object in FIG. 1E when a part of the high-resistance film is removed.

The method of using the electrical probe 1 is described in the following paragraphs. Please refer to FIG. 1E and FIG. 1F. FIG. 1E is a cross-sectional view of the electrical probe in FIG. 1A when being pressed against a high-resistance film on a test object. FIG. 1F is a cross-sectional view of the electrical probe and the test object in FIG. 1E when a part of the high-resistance film is removed. In FIG. 1E and FIG. 1F, a test object 2 is, for example, a semiconductor chip or an electrode of a battery. Moreover, a high-resistance film 3 is provided to cover the test object 2. The high-resistance film 3 is, for example, an oxide thin film such as $SiO_2$, or a polymer layer having low electric conductivity.

As shown in FIG. 1E, when the electrical probe 1 is in contact with the test object 2, the conductive member 120 and contacting portions 320 of the pins 30 touch the high-resistance film 3. As shown in FIG. 1F, when the electrical probe 1 is pushed downward, the ends of the contacting portions 320, which touch the high-resistance film 3, are moved along the surface of the test object 2 in a horizontal direction. Since the inserting portion 310 and the contacting portion 320 have the obtuse angle $\theta 1$, and the extension axis A1 and the central axis A2 have the acute angle $\theta 2$, the contacting portions 320 are able to break through the high-resistance film 3 and remove a part of the high-resistance film 3 while moving along the surface of the test object 2. As a result, the contacting portions 320 are in electrically contact with the test object 2 so as to create a low resistance contact between the test object 2 and the pins 30. Accordingly, electric current is able to flow into the test object 2 via the contacting portions 320, and then flow into the conductive member 120 via the test object 2 to measure an electrical resistance of the test object 2.

As shown in FIG. 1D, in this embodiment, the obtuse angle $\theta 1$ is less than or equal to 105 degrees, and the acute angle $\theta 2$ is greater than or equal to 75 degrees. Therefore, when the pins 30 are bent further, the contacting portions 320 are able to be moved along and in tight contact with the high-resistance film 3 so as to well remove the high-resistance film 3 on paths of the contacting portions 320, thereby forming low resistance contacts between the pins 30 and the test object 2. When the obtuse angle $\theta 1$ is too large or the acute angle $\theta 2$ is too small, the contacting portions 320 are easily broken due to the external force applied on the electrical probe 1. When the obtuse angle $\theta 1$ is too small or the acute angle $\theta 2$ is too large, the contacting portions 320 are difficult to form the low resistance contacts because the high-resistance film 3 cannot be well removed by the contacting portions 320.

As shown in FIG. 1E, in this embodiment, the bent section 312 of the inserting portion 310 of the pin 30 is pressed against the first inner side wall 2131 of the opening 213, and the connecting section 314 of the inserting portion 310 is pressed against the second inner side wall 2132. That is, the bent section 312 and the connecting section 314 are pressed against the inner side wall of the opening 213, which provides a contact interference between the inserting portion 310 and the opening 213 to increase their assembly strength, thereby preventing the pin 30 from accidentally detaching from the opening 213.

As shown in FIG. 1F, in this embodiment, when the pin 30 is bent further, at least a part of the contacting portion 320 is further inside the recess 221. Therefore, when the electrical probe 1 is pushed downward, the circular extending portion 220 is able to penetrate through the high-resistance film 3 so as to electrically contact the test object 2, and thus a contact area between the electrical probe 1 and the test object 2 is increased. As a result, the electrical resistance between the electrical probe 1 and the test object 2 is decreased, thereby preventing incorrect result of the electrical properties test due to overly small contact area.

As shown in FIG. 1D, in this embodiment, the length L1 of the inserting portion 310 in the base portion 210 is larger than the length L2 of the opening 213. Therefore, When the probe head 20 is mounted to the assembling member 110 of the main body 10, an end of the inserting portion 310 opposite to the contacting portion 320 is able to directly electrically contact with the assembling member 110 so as to ensure the low resistance contact between the pin 30 and the main body 10, thereby preventing incorrect result of the electrical properties test due to overly large electrical resistance between the pin 30 and the main body 10.

As shown in FIG. 1C, in this embodiment, the openings 213 are arranged in a staggered pattern, and the distance D1 between the through hole 212 and one of the opening 213 relatively close to the through hole 212 is smaller than the distance D2 between the through hole 212 and one of the other openings 213 relatively away from the through hole 212. Therefore, the distance between each adjacent opening 213 is not too small to maintain the structural strength of the probe head 20.

Figure 2:
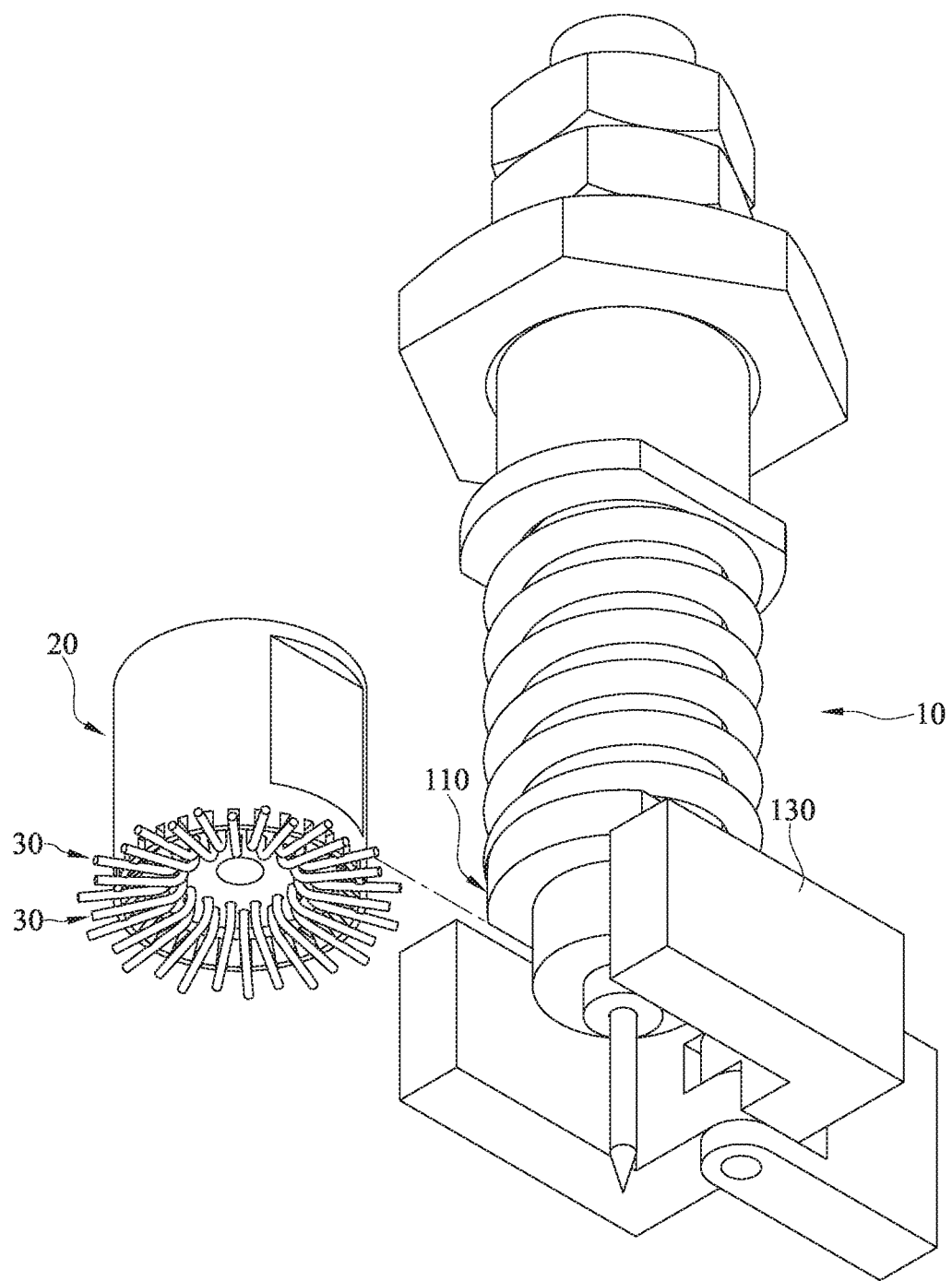
FIG. 2 is an exploded view of an electrical probe according to a second embodiment of the disclosure.

The present disclosure is not limited to the details in the first embodiment. Please refer to FIG. 2, which is an exploded view of an electrical probe according to a second embodiment of the disclosure. Since the second embodiment is similar to the first embodiment, only the differences are illustrated hereafter.

One of the differences between these two embodiments is that a probe head 20 is not screwed to the assembling member 110 of the main body 10. In detail, in this embodiment, the main body 10 further includes a gripper 130 disposed on the assembling member 110. The gripper 130 includes two fingers for clamping objects, and each finger extends in a radial direction of the assembling member 110. The probe head 20 is able to be detachably fastened on the gripper 130 by being clamped by the fingers of the gripper 130.

Figure 3A:
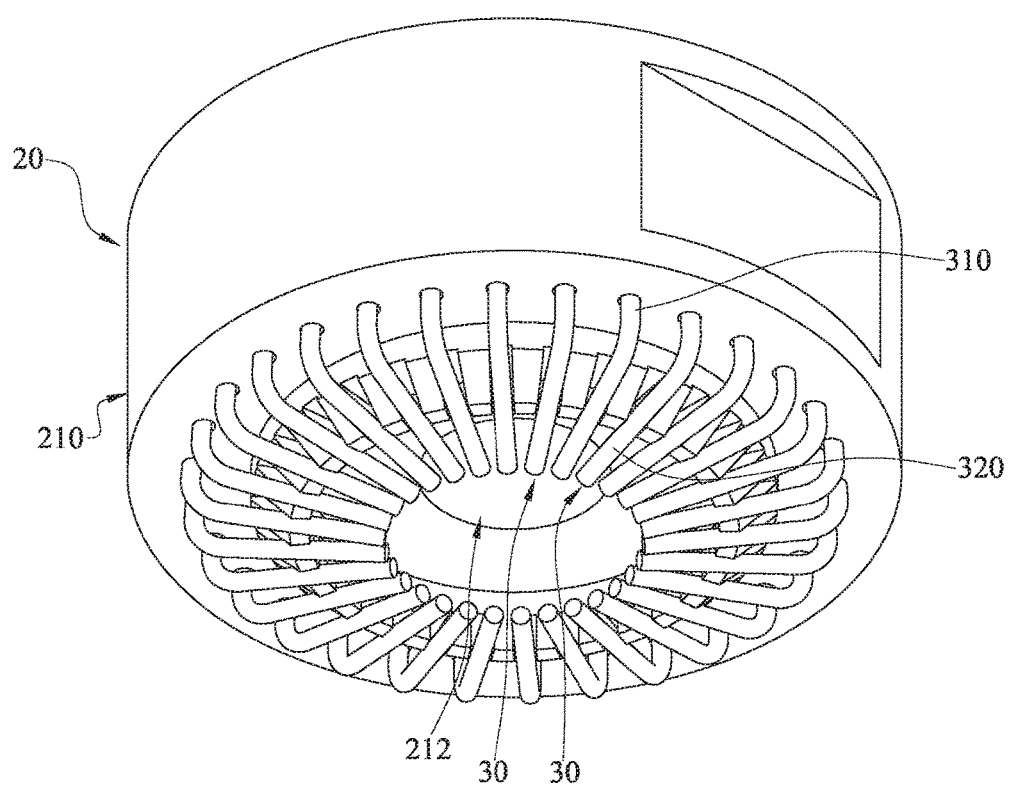
FIG. 3A is a perspective view of a probe head and a plurality of pins according to a third embodiment of the disclosure.
Figure 3B:
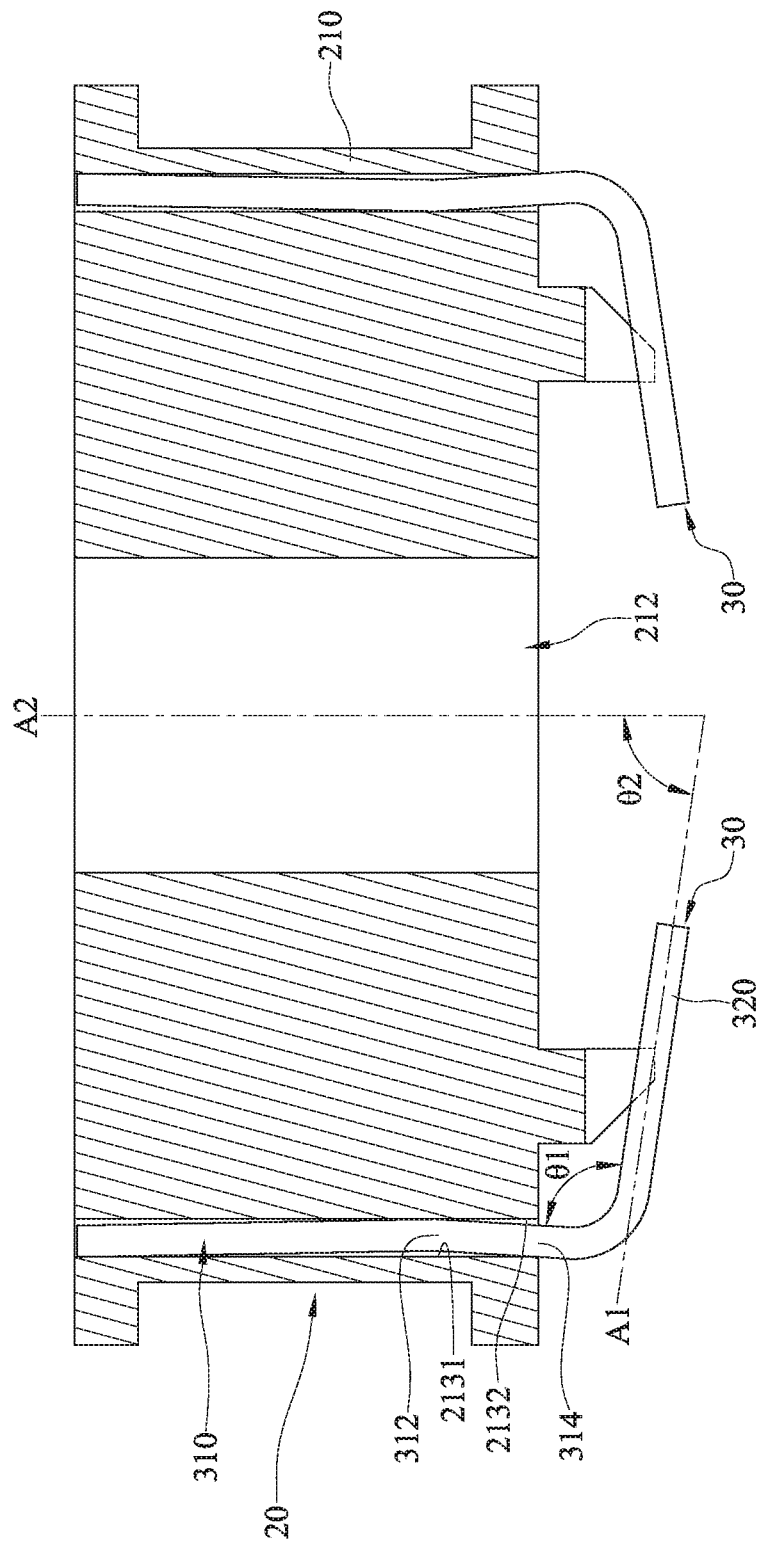
FIG. 3B is a cross-sectional view of the probe head and the pins in FIG. 3A.

The present disclosure is not limited to the details in the first and the second embodiments. Please refer to FIG. 3A and FIG. 3B. FIG. 3A is a perspective view of a probe head and a plurality of pins according to a third embodiment of the disclosure. FIG. 3B is a cross-sectional view of the probe head and the pins in FIG. 3A. Since the third embodiment is similar to the first embodiment, only the differences between these two embodiments are illustrated hereafter.

As shown in FIG. 3B, in this embodiment, the contacting portion 320 of each pin 30 extends inward. Each pin 30 has an obtuse angle θ1 between the inserting portion 310 and the contacting portion 320 and an acute angle θ2 between the extension axis A1 of the contacting portion 320 and the central axis A2 of the through hole 212. When the electrical probe is pushed downward to bend the pin 30, the contacting portion 320 is moved in a direction opposite to the movement direction of the contacting portion 320 in the first embodiment. Furthermore, in this embodiment, the bent section 312 of the pin 30 is pressed against the second inner side wall 2132, and the connecting section 314 of the inserting portion 310 is pressed against the first inner side wall 2131.

Figure 4A:
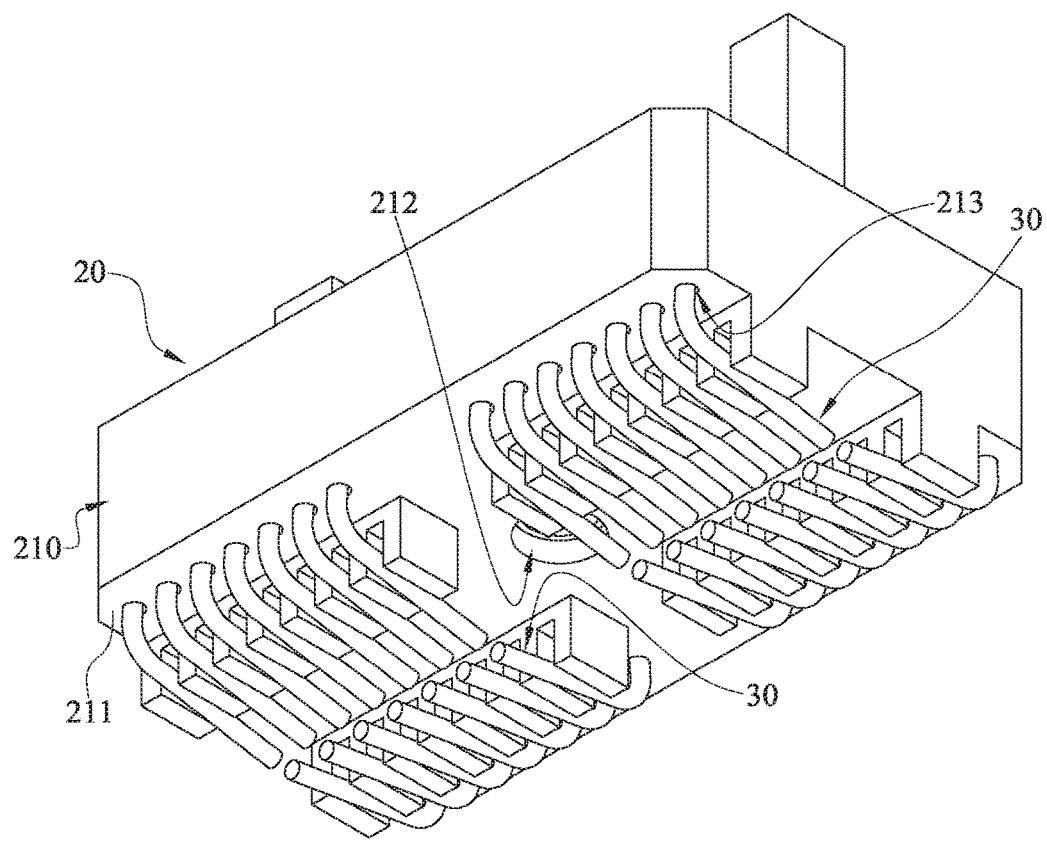
FIG. 4A is a perspective view of a probe head and a plurality of pins according to a fourth embodiment of the disclosure.
Figure 4B:
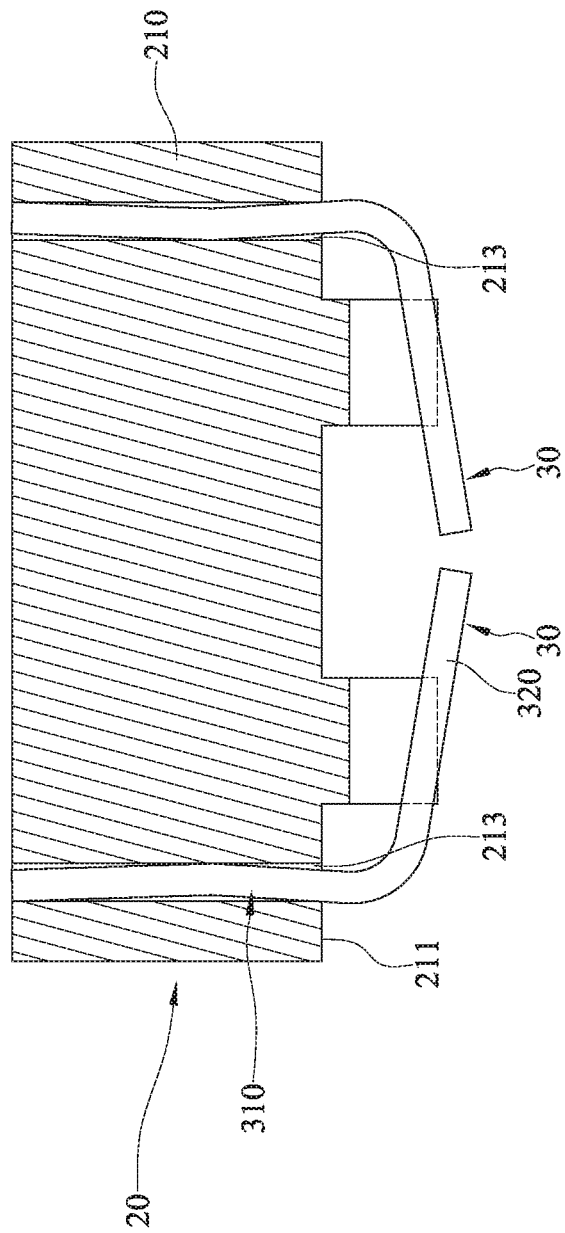
FIG. 4B is a cross-sectional view of the probe head and the pins in FIG. 4A.

The present disclosure is not limited to the details in the first to third embodiments. Please refer to FIG. 4A and FIG. 4B. FIG. 4A is a perspective view of a probe head and a plurality of pins according to a fourth embodiment of the disclosure. FIG. 4B is a cross-sectional view of the probe head and the pins in FIG. 4A. Since the fourth embodiment is similar to the first embodiment, only the differences between these two embodiments are illustrated hereafter.

In this embodiment, the shape of the surface 211 of the base portion 210 of the probe head 20 is rectangle, but the disclosure is not limited thereto. In other embodiments, the shape of the surface 211 can be square, rhombus or oblong. The pins 30 are arranged in pairs, and the pins 30 are respectively inserted into the openings 213 in two rows. In detail, from the view of FIG. 4A, the through hole 212 is located on the center of the surface 211. Some of the pins 30 are disposed on the left region of the surface 211, and the rest of the pins 30 are disposed on the right region of the surface 211. The two groups of the pins 30 on the left and right regions are substantially symmetrical about the through hole 212. For each pair of the pins 30, two ends of the two pins 30 point toward each other. More specifically, the contacting portions 320 of the two pins 30 in each pair extend toward each other, but the disclosure is not limited thereto. In other embodiments, the pins 30 on the left and right regions can be arranged in a staggered pattern. Moreover, in another embodiment, the contacting portions 320 of the two pins 30 in each pair can extend away from each other.

Figure 5:
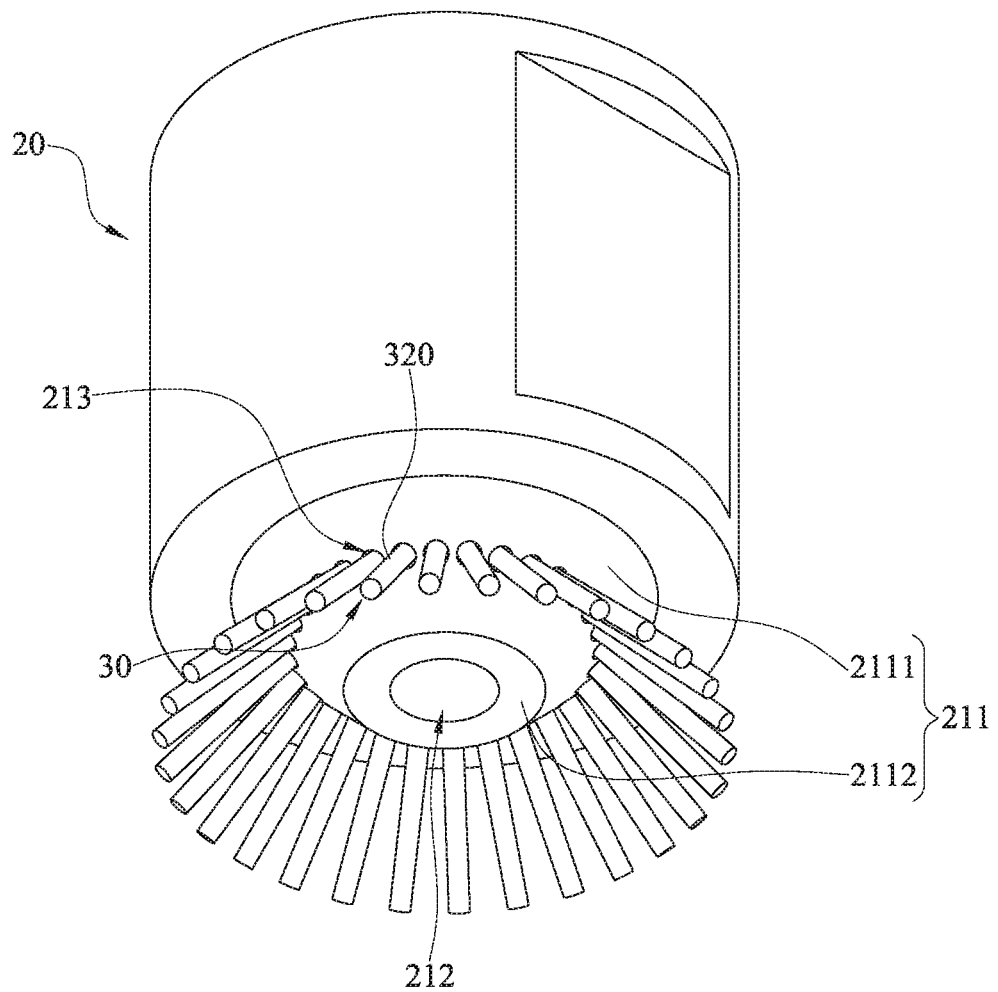
FIG. 5 is a perspective view of a probe head and a plurality of pins according to a fifth embodiment of the disclosure.

FIG. 5 is a perspective view of a probe head and a plurality of pins according to a fifth embodiment of the disclosure. Since the fifth embodiment is similar to the first embodiment, only the differences between these two embodiments are illustrated hereafter.

In this embodiment, each pin 30 is straight. The surface 211 of the probe head 20 has a circular sloping section 2111 and a planar section 2112 surrounded by the circular sloping section 2111, and the surface 211 has an obtuse angle between the circular sloping section 2111 and the planar section 2112. The through hole 212 is on the planar section 2112, and the openings 213 is on the circular sloping section 2111. The pins 30 are respectively inserted into the openings 213, and the contacting portions 320 extend away from the circular sloping section 2111 and outward from the central axis of the through hole 212.

Figure 6:
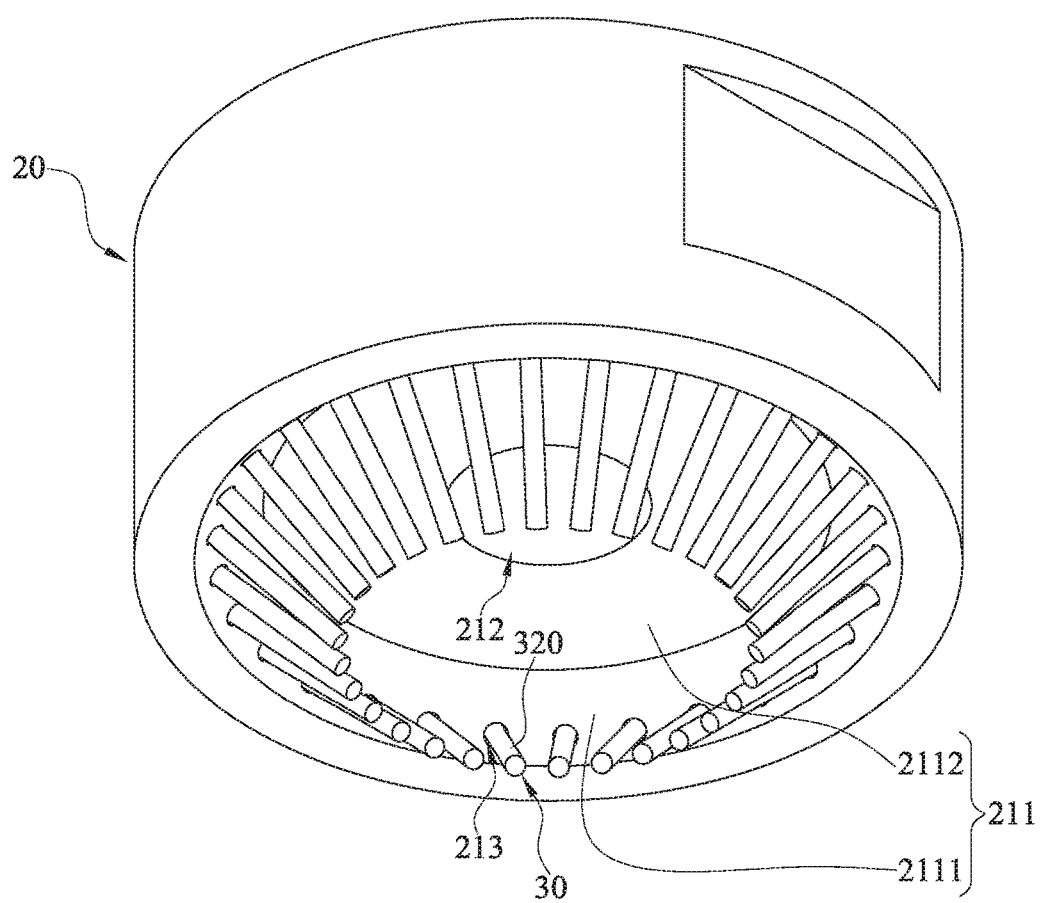
FIG. 6 is a perspective view of a probe head and a plurality of pins according to a sixth embodiment of the disclosure.

FIG. 6 is a perspective view of a probe head and a plurality of pins according to a sixth embodiment of the disclosure. Since the sixth embodiment is similar to the fifth embodiment, only the differences between these two embodiments are illustrated hereafter.

In the fifth embodiment, the circular sloping section 2111 and the planar section 2112 jointly form a protruded cone. In this embodiment, the circular sloping section 2111 and the planar section 2112 jointly form a recessed cone. In addition, the contacting portions 320 extend away from the circular sloping section 2111 but inward the central axis of the through hole 212.

According to the disclosure, each pin has an obtuse angle between the contacting portion and the inserting portion and an acute angle between the extension axis of the contacting portion and the central axis of the through hole. Therefore, when the electrical probe is pushed downward to press against the test object, the pins are bent further so that the contacting portions are able to break through the high-resistance film to remove a part of the high-resistance film. As a result, the contacting portions are able to electrically contact the test object via a low resistance contact.

The foregoing description, for the purpose of explanation, has been described with reference to specific embodiments; however. The embodiments were chosen and described in order to explain the principles of the disclosure and its practical applications, to thereby enable others skilled in the art to utilize the disclosure and various embodiments with various modifications as are suited to the particular use being contemplated. The embodiments depicted above and the appended drawings are exemplary and are not intended to be exhaustive or to limit the scope of the disclosure to the precise forms disclosed. Modifications and variations are possible in view of the above teachings.

What is claimed is:

1. An electrical probe, comprising:
   a main body;
   a probe head disposed on the main body, the probe head having a surface and a plurality of openings on the surface; and
   a plurality of pins each comprising a contacting portion and an inserting portion connected to each other, each of the pins having an obtuse angle between the contacting portion and the inserting portion, and the inserting portions of the plurality of pins respectively inserted into the plurality of openings,
   wherein a diameter of each of the plurality of openings is larger than an outer diameter of each of the inserting portions, each of the plurality of openings has a first inner side wall, the inserting portion comprises a bent section, and the bent section is pressed against the first inner side wall.

2. The electrical probe according to claim 1, wherein the obtuse angle is less than or equal to 105 degrees.

3. The electrical probe according to claim 1, wherein the inserting portion further comprises a connecting section connected to the contacting portion, each of the openings further has a second inner side wall opposite to the first inner side wall, and the connecting section is pressed against the second inner side wall.

4. The electrical probe according to claim 1, wherein the main body comprises an assembling member and a conductive member disposed through the assembling member, the probe head is disposed on the assembling member, the probe head further has a through hole, and the conductive member is disposed through the through hole.

5. The electrical probe according to claim 1, wherein the probe head comprises a base portion and a circular extending portion, the base portion has the surface and the plurality of openings, the circular extending portion is connected to an edge of the base portion, the circular extending portion and the contacting portion of each of the plurality of pins both extend in a direction away from the base portion, a length of the circular extending portion in a normal direction of the surface is smaller than a length of the contacting portion in the normal direction of the surface, the circular extending portion has a plurality of recesses, and the contacting portions of the plurality of pins are respectively located in the plurality of recesses when the plurality of pins are bent.

6. The electrical probe according to claim 1, wherein a length of each of the inserting portions is larger than a length of each of the plurality of openings.

7. The electrical probe according to claim 1, wherein the probe head is screwed to an end of the main body.

8. The electrical probe according to claim 1, wherein the main body comprises a gripper with two fingers extending in a radial direction of the main body, and the probe head is clamped by the gripper.

9. An electrical probe, comprising:
   a main body comprising an assembling member and a conductive member disposed through the assembling member;
   a probe head disposed on the main body, the probe head having a surface, a through hole and a plurality of openings, the plurality of openings and the through hole being on the surface, and the conductive member disposed through the through hole; and
   a plurality of pins each comprising a contacting portion and an inserting portion connected to each other, the inserting portions of the plurality of pins respectively inserted into the plurality of openings, the contacting portion extending from the surface along a direction away from the probe head, and an extension axis of the contacting portion and a central axis of the through hole having an acute angle therebetween,
   wherein a diameter of each of the plurality of openings is larger than an outer diameter of each of the inserting portions, each of the plurality of openings has a first inner side wall, the inserting portion comprises a bent section, and the bent section is pressed against the first inner side wall.

10. The electrical probe according to claim 9, wherein the acute angle is greater than or equal to 75 degrees.

11. The electrical probe according to claim 9, wherein the inserting portion further comprises a connecting section connected to the contacting portion, each of the plurality of openings further has a second inner side wall opposite to the first inner side wall, and the connecting section is pressed against the second inner side wall.

12. The electrical probe according to claim 9, wherein the probe head comprises a base portion and a circular extending portion, the base portion has the surface and the plurality of openings, the circular extending portion is connected to an edge of the base portion, the circular extending portion and the contacting portion of each of the plurality of pins both extend in a direction away from the base portion, a length of the circular extending portion in a normal direction of the surface is smaller than a length of the contacting portion in the normal direction of the surface, the circular extending portion has a plurality of recesses, and the contacting portions of the plurality of pins are respectively located in the plurality of recesses when the plurality of pins are bent.

13. The electrical probe according to claim 9, wherein a length of each of the inserting portions is larger than a length of each of the plurality of openings.

* * * * *